US006850411B1

(12) United States Patent
Patel

(10) Patent No.: US 6,850,411 B1
(45) Date of Patent: Feb. 1, 2005

(54) METHOD AND STRUCTURE TO SUPPORT HEAT SINK ARRANGEMENT ON CHIP CARRIER PACKAGES

(75) Inventor: Janak G. Patel, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/680,858

(22) Filed: Oct. 7, 2003

(51) Int. Cl.[7] .................................................. H05K 7/20
(52) U.S. Cl. ........................ 361/704; 361/719; 257/706; 257/712
(58) Field of Search ................................ 361/704, 707, 361/718, 719; 257/706, 712, 718, 722; 174/16.1, 16.3; 165/80.3, 185

(56) References Cited

U.S. PATENT DOCUMENTS

| | | | | |
|---|---|---|---|---|
| 5,654,876 A | * | 8/1997 | Sathe et al. ................. | 361/704 |
| 5,863,814 A | * | 1/1999 | Alcoe et al. ................ | 438/117 |
| 5,870,285 A | | 2/1999 | Kosteva et al. | |
| 6,362,516 B1 | | 3/2002 | Waters | |
| 6,392,887 B1 | | 5/2002 | Day et al. | |
| 6,430,050 B1 | | 8/2002 | Hensley et al. | |
| 6,472,742 B1 | * | 10/2002 | Bhatia et al. ................ | 257/713 |
| 6,501,658 B2 | * | 12/2002 | Pearson et al. ............. | 361/709 |
| 6,557,675 B2 | * | 5/2003 | Iannuzzelli .................. | 188/380 |
| 6,703,560 B2 | * | 3/2004 | Coico et al. ................ | 174/52.4 |

OTHER PUBLICATIONS

IBM Technical Disclosure Bulletin "Air–Cooled Module Heat Dissipation", G. Dumaine, et al.; vol. 20, No. 4, Sep. 1977.

* cited by examiner

Primary Examiner—Boris Chérvinsky
(74) Attorney, Agent, or Firm—Scully, Scott, Murphy & Presser; William H. Steinberg

(57) ABSTRACT

A method and an arrangement for the supporting of the weight of a heat sink or heat-dissipating thermal structure, which is arranged on the surface of a chip carrier packages. More specifically, the arrangement and method are directed to relieving stresses generated by the weight of the heat sink in the solder balls between the chip carrier package and a printed circuit board (PCB) through a unique locking connection between the chip carrier package and the printed circuit board.

20 Claims, 2 Drawing Sheets

METHOD AND STRUCTURE TO SUPPORT HEAT SINK ARRANGEMENT ON CHIP CARRIER PACKAGES

BACKGROUND OF THE INVENTION

Field of the Invention

The present invention relates to a method and to an arrangement for the supporting of the weight of a heat sink or heat-dissipating thermal structure, which is arranged on the surface of a chip carrier packages. More specifically, the invention is directed to relieving stresses generated by the weight of the heat sink in the solder balls between the chip carrier package and a printed circuit board (PCB) through a unique locking connection between the chip carrier package and the printed circuit board.

Basically, the compressive mechanical loads placed onto the chip, which are exerted by the weights of the relatively heavy heat sink or thermal heat dissipating structures, the latter of which are arranged on surface mounted solder joint structures, are imparted to the solder joints, for example, such as ball grid arrays (BGA), Ceramic Ball Grid Arrays, (CBGA), Ceramic Column Grid Arrays, Hyper BGA, Flip Chip Plastic Ball Grid Arrays and the like, which are disposed between the chip carrier substrate and the printed circuit board (PCB), resultingly generating stresses in the solder balls or joints.

In essence, as the performance of an electronic chip is increased in a rapid manner, pursuant to the present technology the power generation in the chip will also concurrently be increased at generally the same rate or pace. In effect, the increased power which is encountered in the chip is primarily the result of a rise in operating speed (such as higher frequency operation), a higher capacitance which is due to technological advances, and the presence of a leakage current. Consequently, in order to be able to properly operate the chip and to meet the requirements as to the reliability of the electronic package, there must exerted a control over the chip temperature through an adequate removal of generated heat therefrom. Thus, chip temperature can be efficiently controlled by mounting an appropriate thermal or heat-dissipating arrangement over the chip or the package component, which generates heat. Ordinarily, such a heat-dissipating structure or arrangement may comprise a lid or cap constituted of a heat-absorbing and dissipating material, and which also may be equipped with heat dissipating fins, to enhance heat removal as is well-known in the technology.

Presently, ever lager-sized and resultingly heavy heat sink or thermal structures are required to be employed in the chip carriers in view of the increase in chip performance and power, although the chip sizes are constantly being reduced or miniaturized in size and as a result, even the overall chip carrier package size is decreased in size by a commensurate amount. Nevertheless, to the contrary, the sizes and weights of the heat sinks or the thermal or heat-dissipating structures which are supported on the chip carriers or substrates, must be increased in order to be able to maintain the range of chip temperatures within predetermined limits which are required for higher power densities. Consequently, although the thermal problems, in effect, heat-dissipation, are being solved in the technology by utilizing larger and heavier heat sinks or similar heat-dissipating structures which are mounted on the chip carrier package; nevertheless, the mechanical load produced by the heavy heat sinks are transmitted to the package solder ball or column arrays between the chip carriers and PCBs. This essential increase in the encountered mechanical compressive loading has an adverse or detrimental effect on the reliability of the solder joints of the various ball grid arrays, which can seriously affect the operational or service life of the chips and, resultingly, that of the chip carrier package.

Although there can be contemplated the problems, which are present due to the heavier ever-increasing weights of the heat sinks or similar mechanical thermal arrangements, not always is there provided an inexpensive solution to the problems in the stresses encountered by the ball joints. For instance, an underfill epoxy may be employed to fill the spaces among the ball arrays or columns of the chip carrier package which are located intermediate the chip carrier and printed circuit board, so as to bypass the additional compressive mechanical loads caused by the heavier heat sinks to the underfill epoxy, and thereby directly to the printed circuit board and not through the solder balls or joints. This requires the cost of applying underfill epoxy and curing the epoxy, the latter being non-reworkable, whereby if the module or electronic package fails, the entire PCB assembly, including any other package components, must be discarded, or individually and expensively reclaimed and reconditioned.

Alternatively, shims can be provided about the periphery of the chip carrier package in order to bypass additional compressive stresses caused by mechanical loads due to the heavier heat sinks, which are directed to the PCB through the chip carrier and conversely. This necessitates the cost of employing and installing shims and the complex assembling thereof. Furthermore, any shim manufacture may be extremely or even prohibitively expensive, and due to variations in thickness encountered in the spaces or solder ball housing gaps between the chip carrier and the printed circuit board, requires an extremely complex handling in the assembly thereof.

Furthermore, utilizing wedge shaped shims is also an expensive proposition in an attempt directed to alleviating the variation problems of underside distances or spacings between the peripherally located solder balls or columns about the edge regions of the chip carrier, which can vary due to dimensional differences in the solder balls or columns, and on the basis of chip carrier size variations along various physical directions. This can result in electrical shorting and damage to solder balls or columns along the periphery or edge regions of the chip carrier package.

Furthermore, employing a support structure for the chip carrier substrate and/or heat sink on a printed circuit board would take up valuable useable surface area or so called "real estate", thereby reducing the wireability on the printed circuit board, and due to manufacturing variations and module height, extremely precise tolerances and assembling operations would be required in order to ensure a good thermal contact of the heat sink with the module, again rendering the foregoing construction expensive while not being particularly reliable.

The foregoing problems have been addressed to some extent in various ways in the technology, although the solutions have not been particularly cost-effective or simple in the application thereof.

Hensley, et al., U.S. Pat. No. 6,430,050 B1, merely describes the use of screws, which connect a heat-dissipating device, such as the heat sink, to a ball grid array which is located on a substrate, and whereby pressure is applied by means of springs encompassing the screws. This is primarily for the purpose of imparting pressure to the heat sink in order to ensure appropriate electrical contact and does not lend itself to alleviating the compressive forces on the solder balls or joints of a grid array caused by heavier heat sinks.

Similarly, Day, et al., U.S. Pat. No. 6,392,887 B1 discloses heat sinks, which are supported on an integrated circuit package, and wherein resilient components are employed to support the heat sink in order to ensure appropriate electrical contact.

Furthermore, Waters, U.S. Pat. No. 6,362,516 B1; Kosteva, et al., U.S. Pat. No. 5,870,285; Alcoe, et al., U.S. Pat. No. 5,863,814; and IBM Technical Bulletin No. Vol. 20, No. 4, September 1977, "Air-Cooled Module Heat Dissipation, by G. Dumaine, et al., relate to various aspects of mounting heat-dissipating structures, such as heat sinks or the like on chip carrier packages.

However, none of the publications are directed to the inventive aspect as provided herein in the novel structure and method of reducing the weight of such heavier and larger heat sinks or other similar thermal or heat-dissipating structures from being transmitted in an adverse manner to the ball grid arrays of chip carrier package.

SUMMARY OF THE INVENTION

Accordingly, pursuant to the present invention, there is provided an electronic package including a plurality of threaded members, such as screws, consisting of a compliant material, which are threadingly engaged inserted from the bottom of a printed circuit board (PCB) into screwthreaded apertures provided in the latter, so as to support an electronic package, in which the screws or the like are arranged in the area of the shadow of the electronic package, the latter comprising a chip carrier or substrate, with solder joints or balls being interposed between the printed circuit board and chip-carrying substrate, and with a heat sink being supported on the chip carrier or substrate, whereby the screws which are arranged in the area of the shadow of the electronic package are preferably but not necessarily located at the corners thereof.

The shaft portions of the compliant screws may also be equipped with appropriate encompassing spring structures, which are adapted to compensate for irregularities in the surface of the printed circuit board and in the heights or spacing of the ball grid arrays intermediate the chip carrier or substrate and the printed circuit board, whereby resultingly compensation is provided for differences in the spatial and physical aspects of the structures while reducing stresses in the solder balls and joints in the regions or corners of the package where the screws are provided for this package.

Accordingly, it is an object of the present invention to provide a novel structure which is interposable between a chip carrier package and a printed circuit board adapted to relieve stresses in solder balls connecting the components, which stresses are produced by mechanical compressive loads from the weights of superimposed heat sink arrangements, or the chip carrier package substrate alone.

Another object of the invention is to produce a stress-relieving arrangement for the solder balls as described herein, which comprises compliant screws extending between the chip carrier package and the printed circuit board.

Still another object of the present invention resides in the provision of a novel method of employing the novel structure for relieving stresses produced in solder balls located between a chip carrier package and printed circuit board, which are caused by the mechanical compressive weights of a heat sink which is mounted on the chip carrier package.

BRIEF DESCRIPTION OF THE ACCOMPANYING DRAWINGS

Reference may now be made to the following detailed description of preferred embodiment of the invention, taken in conjunction with the accompanying drawings, in which.

DETAILED DESCRIPTION OF THE PREFERRED EMBODIMENTS

Figure 1:
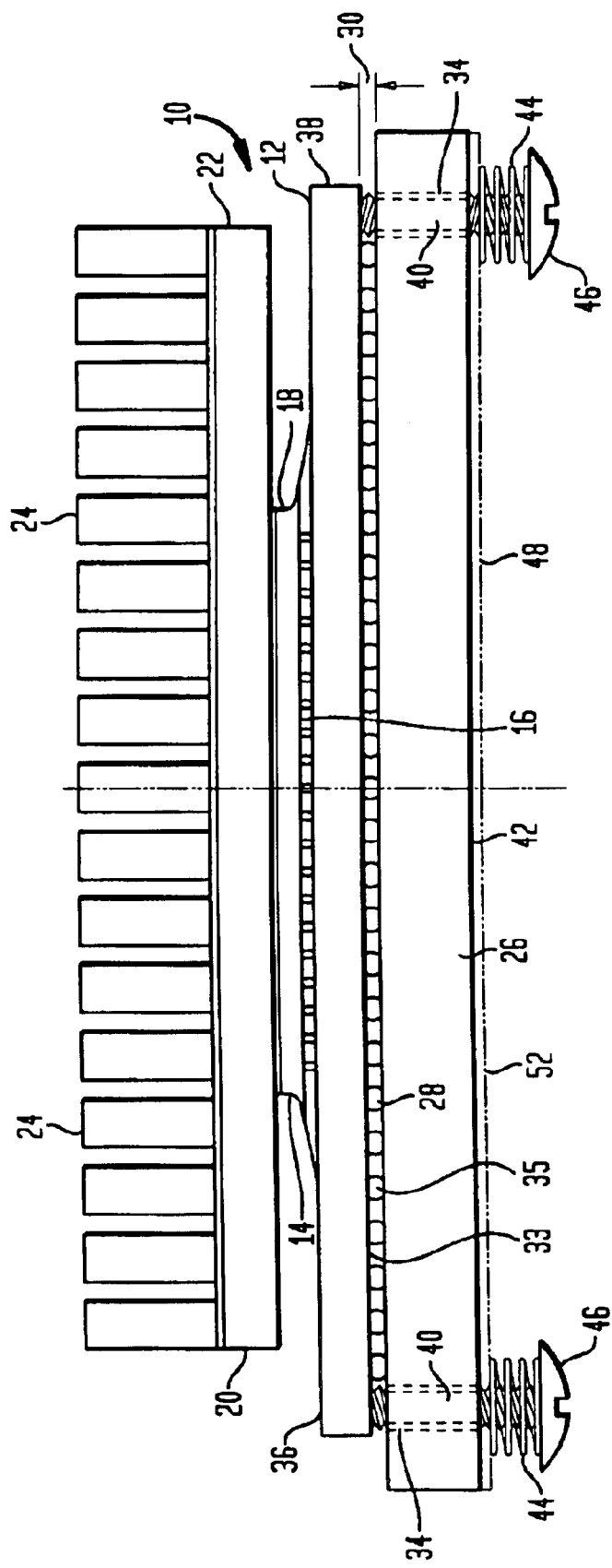
FIG. 1 illustrates a diagrammatic elevational view of a structure for the support of a heat sink on a surface mounted ball grid array chip carrier package.

Referring in greater particularity to the drawings, as shown in FIG. 1, there is generally diagrammatically indicated a module or an electronic chip carrier package 10, which is constructed pursuant to the present invention.

In particular, the electronic package 10 comprises a plate-shaped chip carrier 12 which may be constituted of a ceramic substrate or organic laminate, as is well known in the technology. Supported on the chip carrier 12 is a microchip 14; for example a flip-chip which through the intermediary of suitable connections 16 and adhesives 18 has a heat sink arrangement 20 mounted thereon adapted to assume and dissipate heat generated from the chip 14 during operation of the electronic package 10. The heat-sink arrangement 20 as shown includes a cap member 22 generally constituted of a thermally conductive heat-dissipating material, and which is essentially of a plate-like construction of either constant or varying thickness. In order to enhance the dissipation or removal rate of heat from the heat sink member or cap 20, which may also be referred to as a lid, a plurality of upstanding spaced fins 24 mounted on or integral with the cap 20, when subjected to an incident airflow, will remove heat assumed by the heat sink member 20 from the chips 14 or other heat-generating elements of the electronic package 10 so as to cool and maintain the chip at acceptable operating temperatures.

The substrate 12 may be mounted or, as known, supported on a printed circuit board 26 with an interconnection thereto provided by a solder ball array 28 and wherein the chip carrier package comprising the substrate 12 and the chip or multiple chips 14 mounted thereon, is connected to the printed circuit board by means of the solder joints or balls 28, and then subjected to a heat reflow operation, as is well known in the art and, thus, need not be described in further detail hereinbelow.

In essence, the relatively heavy weight of the ever larger-sized heat sink structures or caps 20, which are superimposed or mounted on the chip carrier package or substrate 12, may subject the solder balls 28 arranged intermediate the chip carrier substrate and the printed circuit board 26 to excessive mechanical compressive loads, especially the solder balls 28 located proximate the corners or edges of the substrate 12, which, at times, may cause damage to be sustained by the solder joints and any electrical connections of the package. In this connection, the solder joint or ball height or stand off 30, which is the space present between the facing surfaces 33, 35 of, respectively, the chip carrier substrate 12 and the printed circuit board 26, may be subject to differentiations in solder joint height, for example, due to variations between the diameters of the solder balls 28 to solder balls, due to different suppliers for these particular components during the manufacture thereof, wherein each manufacturer may be operating at different production tolerances. Furthermore, variations in the volume of solder paste for the solder balls 28 or column joints at the points of attachment between the chip carrier 12 and the printed circuit board 26 may also be encountered, and, in addition, may also be present due to variations in the degree of flatness of both the facing surfaces of the chip carrier 12 and the printed circuit board 26 at locations or areas where the chip carrier is attached to the printed circuit board. AU of these different manufacturing tolerances and constructional variations may adversely effect the reliability and functioning of the electrical connections of the solder balls and joints, particularly, those proximate the edges and/or corners of the chip carrier package where the latter faces towards the printed circuit board.

Figure 2:
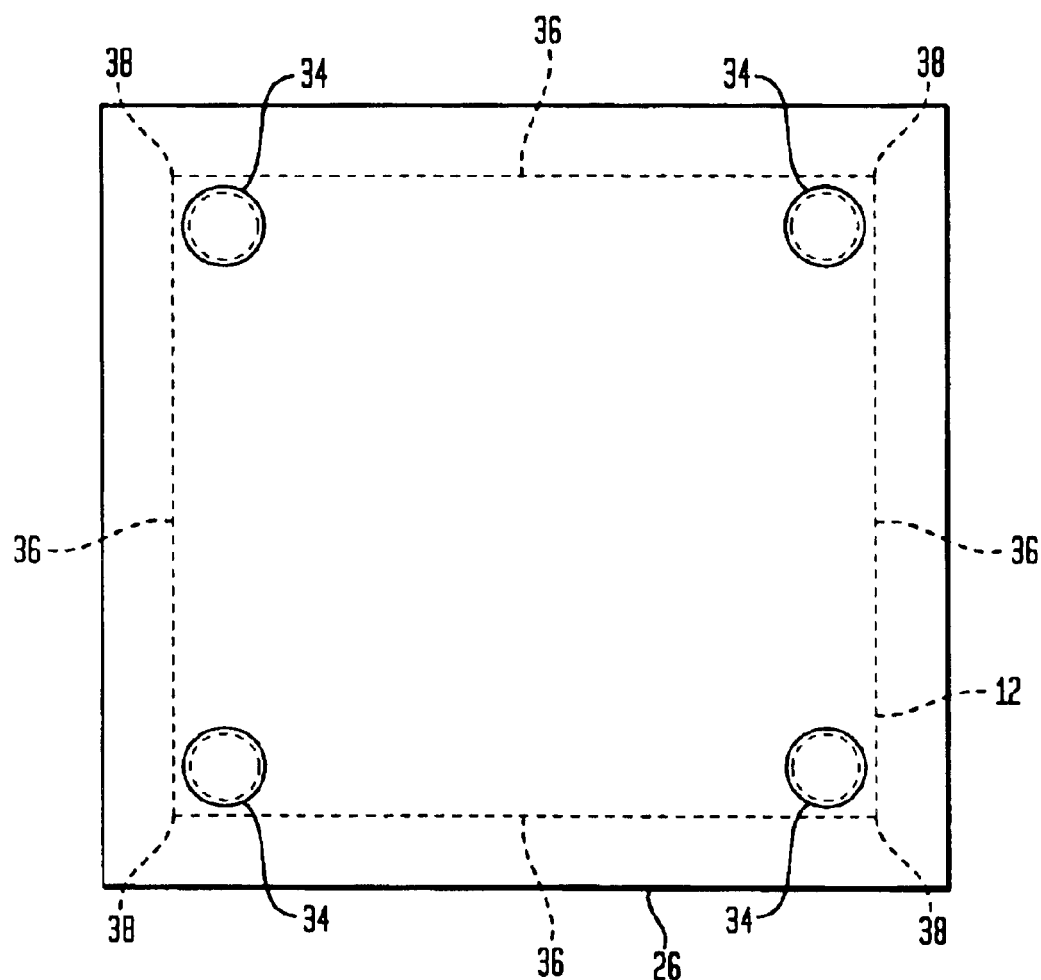
FIG. 2 illustrates a generally diagrammatic plan view of a printed circuit board showing the locations for threaded apertures which are adapted to receive compliant support screws for the support structure.

Accordingly, in order to provide the novel support structure for compensating for the excessive mechanical stresses imposed on the solder balls 28, especially at the corners or edges of the substrate or chip carrier 12, as illustrated in FIG. 1, and also as shown in FIG. 2 of the drawings, the printed circuit board 26 is provided with threaded through apertures 34, preferably approximately in alignment with the edge areas 36 or corners 38 of the chip carrier or substrate 12, inasmuch as generally the highest stresses in the solder balls are encountered in those particular edge or corner regions.

Thus, in order to compensate for the stresses which are caused by the heavy mechanical compressive loads exerted by the heat sink or lid structure, or chip carrier 12 alone, screws 40 consisting of a compliant material are inserted through the threaded apertures 34 from the opposite surface 42 of the printed circuit board, and engage and contact the corners 38 or edge regions 36 of the chip carrier package.

Furthermore, in order to compensate for any encountered variations in the solder joint height or standoff 30, as illustrated in FIG. 1 of the drawings, helical or coil springs 44 may be provided encompassing the compliant screws 40 between the bottom or opposite surface 42 of the printed circuit board 26 and a wider head end 46 of each screw 40 so as to provide a further adjustable force to the corners 38 of the printed circuit board 26. This utilization of the compliant screws acting on the surface edge or corners of the chip carrier 12 will exert a counteracting effect on the weight of the heavy heat sink 20, and counteract the stresses caused by the weight thereof acting on the chip carrier package and the solder balls 28.

Furthermore, the screws 40 may be constituted of compliant materials which can be varied and determined as desired by the coefficient of thermal expansion (CTE) of both the chip carrier package 12 and printed circuit board structures 26. For example, if ceramic chip carrier materials are used for the substrate 12, the compliant screws 40 can be constituted of either Kovar (Reg. TM) or beryllium copper alloy materials, and the springs 44 can also be selected from suitable materials.

Although, as indicated in FIG. 2 of the drawings, four screws 40 are utilized adapted to contact the corners 38 of a rectangular chip carrier substrate 12, it is possible to contemplate that larger numbers of screws may be strategically provided along the peripheral edges 36 of the chip carrier substrate 12, so as to further compensate for stresses in the solder balls in those regions caused by the heavier acting weight of the heat sink arrangement. Screws can be placed anywhere in the chip carrier shadow.

Figure 3:
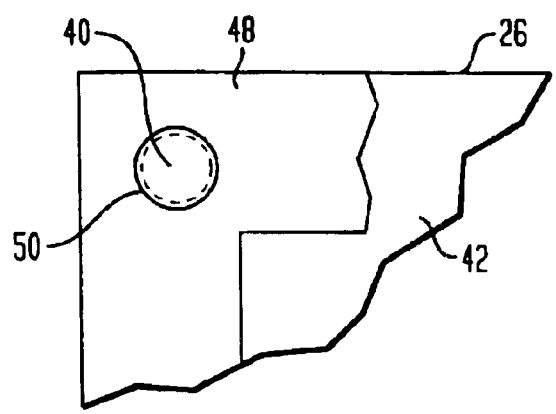
FIG. 3 illustrates, on an enlarged scale, a fragmentary detail of a modified support structure for the screw-receiving aperture in the printed circuit board.

In addition to the foregoing, as schematically indicated by the fragmentary representation in FIG. 3 of the drawings, and with phantom-lines in FIG. 2, the bottom surface 42 of the printed circuit board 26, opposite the surface which faces the surface of the chip carrier package 12, may be provided with a flat plate or frame structure 48, such as of metal or the like, having apertures 50 through which the shanks of the screws 40 may be passed and the bottom surfaces 52 of which may be contacted by the helical or compression springs 44. These additional plates or corner frames or similar structures may also serve to compensate for encountered variations in the bottom surface of the printed circuit board and assist each spring in correlating with or compensating for such variations so as to further reduce stresses in the solder balls 28 at those locations. The plate or plates also provide additional mechanical strength for the entire assembly.

In essence, the present invention is relatively simple in nature in that it does not necessitate any precise dimensional control over the size of each of the threaded holes or apertures formed in the printed circuit board, spring size, screw size, and location of the threaded apertures or the like, and also does not necessitate the need for any additional real estate on the printed circuit board.

Furthermore, the threaded apertures which are provided for the receiving of screws 40 in the printed circuit board 26 can be electrically connected to the ground plane of the printed circuit board, and any pads at the corners of the chip carrier can be tied to the ground plane of the package and, thus, provide a ground return path.

The corner solder balls, at each of the four (4) corners 38 of the essentially rectangular or square chip carrier package, are at the highest stress level, so as not necessarily be employable as signal balls where reliability is of importance, and whereby the cost of the components in the assembly of the package would be minimal by replacing these through the threaded apertures in the printed circuit board. Furthermore, there is no risk of any electrical shorting of the chip carrier package balls or columns and the overall cost of the support structure is at a minimum compared to the state-of-the-art, without any technological problems being encountered in the use thereof.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An arrangement for supporting the weight of a heat sink structure which is arranged on a chip carrier package, said chip carrier package including a substrate mounting at least one microchip; a printed circuit board, and an array of solder balls being interposed between said substrate and said printed circuit board and supporting said substrate on said printed circuit board, comprising:

a locking connection extending between said substrate and said printed circuit board;

said locking connection including adjustable compliant structures operatively connected to said printed circuit board and extending into biasing contact with said substrate for counteracting the weight of said heat sink structure and reducing the compressive force thereof generating stresses in the solder balls of said solder ball array.

2. An arrangement as claimed in claim 1, wherein each said adjustable compliant structures comprises a threaded aperture extending through said printed circuit board, and a screw member being arranged in said threaded aperture, said screw member having a free end of the screw in biasing contact with the surface of the substrate which is distant from the substrate surface facing the heat sink structure.

3. An arrangement as claimed in claim 2, wherein said substrate comprises a rectangular or square plate mounting said at least one microchip, a plurality of said screw members, each respectively being in biasing contact with respectively one corner of said substrate so as to relieve compressive stresses acting on the solder balls located in at least said corner regions of the substrate.

4. An arrangement as claimed in claim 3, wherein further said screw members contact said substrate in a spaced relationship proximate the edges of said substrate so as to relieve compressive stresses in solder balls located proximate said edges.

5. An arrangement as claimed in claim 2, wherein said screw member is constituted of a compliant material.

6. An arrangement as claimed in claim 5, wherein said compliant material comprises Kovar (reg. TM).

7. An arrangement as claimed in claim 5, wherein said compliant material comprises beryllium copper alloy.

8. An arrangement as claimed in claim 2, wherein an enlarged head end of said screw projects from a surface of said printed circuit board distant from said substrate; and a helical coil spring encompasses a projecting screw portion intermediate said head end and said printed circuit board surface so as to impart a biasing pressure against said printed circuit board surface.

9. An arrangement as claimed in claim 8, wherein apertured plate means is positioned in surface contact with said printed circuit board surface, said screw member extending through said apertured plate, and said helical coil spring bearing at one end thereof against said plate means.

10. An arrangement as claimed in claim 9, wherein said plate means comprises a frame member extending along the peripheral surface portion of said printed circuit board.

11. A method of supporting the weight of a heat sink structure which is arranged on a chip carrier package, said chip carrier package including a substrate mounting at least one microchip; a printed circuit board, and an array of solder balls being interposed between said substrate and said printed circuit board and supporting said substrate on said printed circuit board, said method comprising:

providing a locking connection between said substrate and said printed circuit board;

said locking connection including adjustable compliant structures operatively connected to said printed circuit board and extending into biasing contact with said substrate for counteracting the weight of said heat sink structure and reducing the compressive force thereof generating stresses in the solder balls of said solder ball array.

12. A method as claimed in claim 10, wherein each said adjustable compliant structures comprises forming a threaded aperture to extend through said printed circuit board, and arranging a screw member in said threaded aperture, said screw member having a free end of the screw in biasing contact with the surface of the substrate which is distant from the substrate surface facing the substrate surface facing the heat sink structure.

13. A method as claimed in claim 12, wherein said substrate comprises a rectangular or square plate mounting said at least one microchip, a plurality of said screw members, each respectively being in biasing contact with respectively one corner of said substrate so as to relieve compressive stresses acting on the solder balls located in at least said corner regions of the substrate.

14. A method as claimed in claim 13, wherein further said screw members contact said substrate in a spaced relationship proximate the edges of said substrate so as to relieve compressive stresses in solder balls located proximate said edges.

15. A method as claimed in claim 12, wherein said screw member is constituted of a compliant material.

16. A method as claimed in claim 15, wherein said compliant material comprises Kovar (reg. TM).

17. A method as claimed in claim 15, wherein said compliant material comprises beryllium copper alloy.

18. A method as claimed in claim 12, wherein an enlarged head end of said screw projects from a surface of said printed circuit board distant from said substrate; and a helical coil spring encompasses a projecting screw portion intermediate said head end and said printed circuit board surface so as to impart a biasing pressure against said printed circuit board surface.

19. A method as claimed in claim 18, wherein apertured plate means is positioned in surface contact with said printed circuit board surface, said screw member extending through said apertured plate, and said helical coil spring bearing at one end thereof against said plate means.

20. A method as claimed in claim 19, wherein said plate means comprises a frame member extending along the peripheral surface portion of said printed circuit board.

* * * * *